(12) United States Patent
Akiyama et al.

(10) Patent No.: US 10,356,897 B2
(45) Date of Patent: Jul. 16, 2019

(54) MULTILAYER SUBSTRATE

(71) Applicant: DENSO CORPORATION, Kariya, Aichi-pref. (JP)

(72) Inventors: Kiyokazu Akiyama, Nisshin (JP); Yasunari Yanagiba, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 0 days.

(21) Appl. No.: 16/065,140

(22) PCT Filed: Nov. 30, 2016

(86) PCT No.: PCT/JP2016/085488
§ 371 (c)(1),
(2) Date: Jun. 22, 2018

(87) PCT Pub. No.: WO2017/110389
PCT Pub. Date: Jun. 29, 2017

(65) Prior Publication Data
US 2019/0008042 A1 Jan. 3, 2019

(30) Foreign Application Priority Data

Dec. 22, 2015 (JP) .................................. 2015-250184

(51) Int. Cl.
*H05K 1/03* (2006.01)
*H05K 1/02* (2006.01)
(Continued)

(52) U.S. Cl.
CPC .............. *H05K 1/03* (2013.01); *H01L 23/66* (2013.01); *H05K 1/024* (2013.01); *H05K 1/0298* (2013.01); *H05K 1/116* (2013.01); *H05K 3/46* (2013.01)

(58) Field of Classification Search
CPC ...... H05K 1/024; H05K 1/0298; H05K 1/116; H05K 1/03; H05K 3/46; H01L 23/66
See application file for complete search history.

(56) References Cited

U.S. PATENT DOCUMENTS

| 7,394,027 B2* | 7/2008 | Kaluzni ................. H01L 23/66 |
| | | 174/262 |
| 9,491,860 B2* | 11/2016 | Akahoshi ............... H01P 5/185 |
| 2002/0034839 A1* | 3/2002 | Iwaki ..................... H01L 23/66 |
| | | 438/107 |

FOREIGN PATENT DOCUMENTS

| JP | H-05160605 | 6/1993 |
| JP | 2009224638 A | 10/2009 |
| JP | 2012129350 A | 7/2012 |

OTHER PUBLICATIONS

International Search Report dated Feb. 21, 2017 of PCT/JP2016/085488.

* cited by examiner

*Primary Examiner* — Timothy J Thompson
*Assistant Examiner* — Amol H Patel
(74) *Attorney, Agent, or Firm* — Harness, Dickey & Pierce, P.L.C.

(57) ABSTRACT

A first land and a first ground pattern generate a first parasitic capacitance CLAND by capacitive coupling with a first insulating layer interposed therebetween. Then, the first parasitic capacitance CLAND is defined as a predetermined capacitance that suppresses an impedance of a via part from changing due to a change in an inductance component of the via part with respect to a first transmission line. As a result, it is possible to match the impedance of the via part with a impedance of the first transmission line by adjusting the first parasitic capacitance CLAND caused by the first land and the first ground pattern. Therefore, it is possible to prevent (Continued)

the transmission characteristics of the multilayer substrate from deteriorating without requiring the disposition of cavities such as through holes in the multilayer substrate.

5 Claims, 7 Drawing Sheets

(51) Int. Cl.
*H01L 23/66* (2006.01)
*H05K 3/46* (2006.01)
*H05K 1/11* (2006.01)

MULTILAYER SUBSTRATE

CROSS REFERENCE TO RELATED APPLICATIONS

This application is a U.S. National Phase Application under 35 U.S.C. 371 of International Application No. PCT/JP2016/085488 filed on Nov. 30, 2016 and published in Japanese as WO 2017/110389 A1 on Jun. 29, 2017. This application is based on and claims the benefit of priority from Japanese Patent Application No. 2015-250184 filed on Dec. 22, 2015. The entire disclosures of all of the above applications are incorporated herein by reference.

FIELD

The present invention relates to a multilayer substrate having a transmission line for transmitting a signal and a method of manufacturing the multilayer substrate.

BACKGROUND

As a multilayer substrate of this type, a multilayer printed substrate described in Patent Document 1, for example, has been conventionally known. In the multilayer printed substrate described in Patent Document 1, a cavity is disposed between a signal via and a ground pattern. Thereby, a capacitance component of the signal via is suppressed from changing, and therefore an impedance of the signal via is adjusted. As a result, transmission characteristics are prevented from deteriorating due to signal reflection at the signal via.

PATENT DOCUMENT

Patent Document 1 Japanese Patent Application Laid-Open Publication No. 2012-129350

SUMMARY

However, since the cavity is disposed in the multilayer printed substrate of Patent Document 1 as described above, strength deterioration of the multilayer printed substrate caused by the cavity mat occur. In addition, conduction defects may occur in the multilayer printed substrate due to the distortion of the multilayer printed substrate when the cavity is processed.

In view of the foregoing, it is an object of the present invention to provide a multilayer substrate and a method of manufacturing the same that can prevent transmission characteristics from deteriorating without requiring a disposition of a cavity.

To achieve the above object, according to a first aspect, a multilayer substrate is a substrate having a plurality of conductor layers laminated in a thickness direction.

A multilayer substrate includes a first line including layer having a first transmission line for transmitting a signal and a first land to which the first transmission line is connected, a second line including layer having a second transmission line for transmitting the signal and a second land to which the second transmission line is connected, an adjacent insulating layer adjacent to one side in the thickness direction with respect to the first line including layer, a first ground including layer laminated with the adjacent insulating layer interposed therebetween with respect to the first line including layer and having a first ground pattern extending in a planar shape, a signal via disposed between the first land and the second land and connects the first land and the second land, another insulating layer different from the adjacent insulating layer, and a second ground including layer formed as a layer different from the ground including layer as a first ground including layer among the plurality of conductor layers and laminated with the second line including layer with the other insulation layer interposed therebetween.

The first line including layer, the second line including layer, and the first ground including layer are included in the plurality of conductor layers, and the signal via, the first land, and the second land are included in a via part in which an inductance component is changed with respect to the first transmission line due to a disposition of the signal via.

The first land and the first ground pattern generate a parasitic capacitance due to capacitive coupling because they sandwich an adjacent insulating layer, and the parasitic capacitance is set to a predetermined capacitance for suppressing an impedance of the via part from changing due to a change in the inductance component of the via part with respect to the first transmission line, the second ground including layer has a second ground pattern electrically connected to the ground pattern as a first ground pattern, the second transmission line includes a line portion adjacent to the second ground pattern with the other insulating layer interposed therebetween, and a land connection portion disposed between the line portion and the second land, and the land connecting portion is included in the via part.

As a result, it is possible to match the impedance of the via part with the impedance of the first transmission line by adjusting the parasitic capacitance caused by the first land and the first ground pattern. Therefore, it is possible to prevent transmission characteristics of the multilayer substrate from deteriorating without requiring a disposition of a cavity.

DESCRIPTION

Hereinafter, embodiments for carrying out the present invention will be described with reference to the drawings. It should be noted that in the following embodiments, the same or equivalent components are denoted by the same reference numerals in the drawings.

First Embodiment

Figure 1:
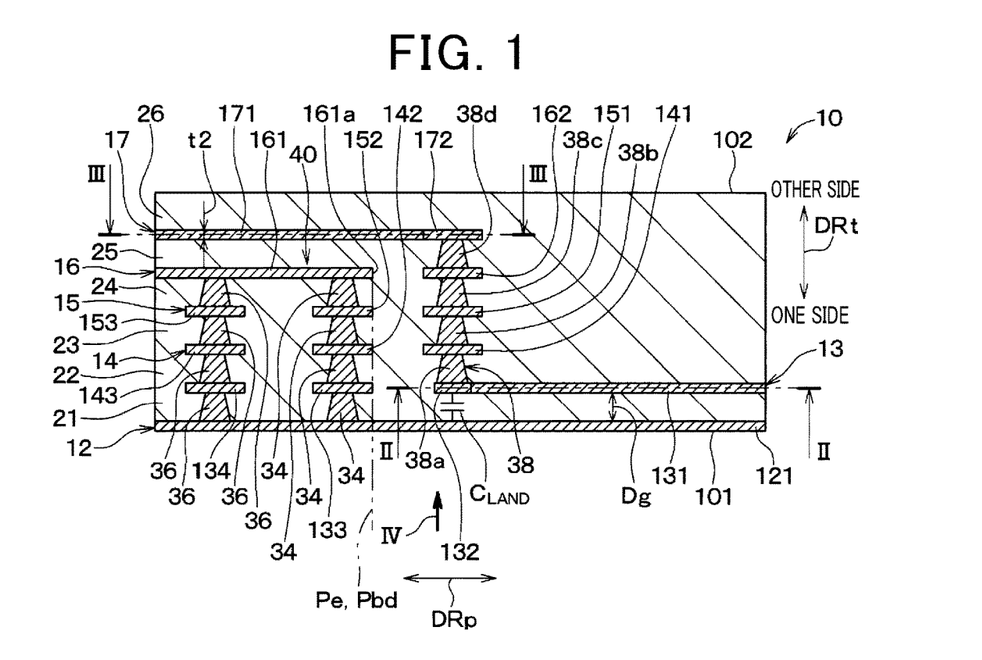
FIG. 1 shows a sectional view of a multilayer substrate in a first embodiment.

FIG. 1 is a sectional view showing a cross section of a multilayer substrate 10 taken along a plane along a thickness direction DRt of the multilayer substrate 10 of the present embodiment. As shown in FIG. 1, the multilayer substrate 10 has a plurality of conductor layers 12, 13, 14, 15, 16, and 17 (hereinafter referred to as a plurality of conductor layers 12 to 17) made of copper foil, for example, and a plurality of insulating layers 21, 22, 23, 24, 25, 26 (hereinafter referred to as a plurality of insulating layers 21 to 26) made of an insulator. The plurality of conductor layers 12 to 17 and the plurality of insulating layers 21 to 26 are alternately laminated in the substrate thickness direction DRt which is the thickness direction DRt of the multilayer substrate 10. In addition, the multilayer substrate 10 also has a plurality of vias 34, 36, 38.

Specifically, the plurality of conductor layers 12 to 17 include a first ground including layer 12 as a first conductor layer, a first line including layer 13 as a second conductor layer, a third conductor layer 14, a fourth conductor layer 15, a second ground including layer 16 as a fifth conductor layer, and a second line including layer 17 as a sixth conductor layer. Thicknesses of conductor patterns of the conductor layers 12 to 17 are the same as each other, for example. In addition, the plurality of insulating layers 21 to 26 include a first insulating layer 21, a second insulating layer 22, a third insulating layer 23, a fourth insulating layer 24, a fifth insulating layer 25, and a sixth insulating layer 26.

That is, the plurality of conductor layers 12 to 17 and the plurality of insulating layers 21 to 26 are formed by laminating the first ground including layer 12, the first insulation layer 21, the first line including layer 13, the second insulation layer 22, the third conductor layer 14, the third insulating layer 23, the fourth conductor layer 15, the fourth insulating layer 24, the second ground including layer 16, the fifth insulating layer 25, the second line including layer 17, and the sixth insulating layer 26 in order from one side to the other side in the thickness direction DRt. In view of the above, the substrate thickness direction DRt is also a lamination direction of the plurality of conductor layers 12 to 17, and also a lamination direction of the plurality of insulating layers 21 to 26.

Figure 2:
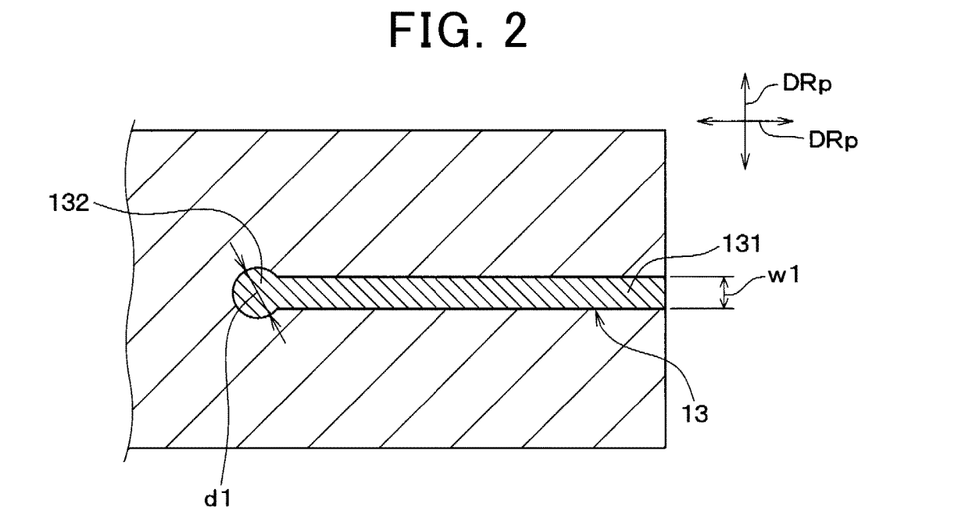
FIG. 2 shows a sectional view taken along a line II-II in FIG. 1.

As shown in FIG. 2, the first line including layer 13 has a first transmission line 131 and a first land 132. The first transmission line 131 is a conductor pattern for transmitting an electrical signal (hereinafter simply referred to as signal) of a high frequency exceeding 1 GHz. A width w1 orthogonal to a longitudinal direction of the first transmission line 131, that is, a line width w1 of the first transmission line 131 is constant over the entire length of the first transmission line 131. Then, the first transmission line 131 linearly extends with its line width w1.

The first land 132 is a conductor pattern to which the first transmission line 131 is connected. The first land 132 has a circular shape having a diameter d1, for example. The diameter d1 of the first land 132 is larger than the line width w1 of the first transmission line 131.

In addition to the first transmission line 131 and the first land 132, the first line including layer 13 has two intermediate ground patterns 133 and 134 as shown in FIG. 1.

Figure 3:
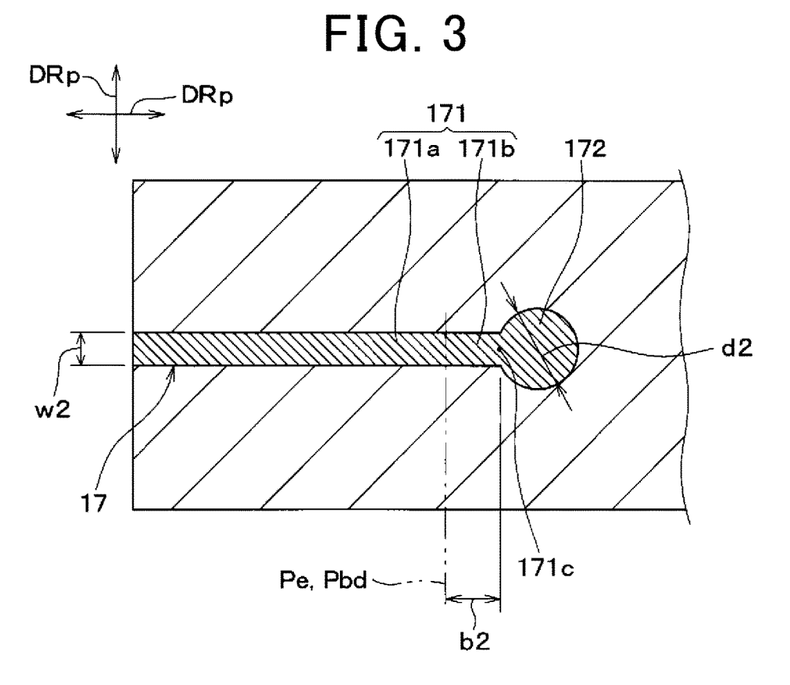
FIG. 3 shows a sectional view taken along a line III-III in FIG. 1.

As shown in FIG. 3, the second line including layer 17 has a second transmission line 171 and a second land 172. Similar to the first transmission line 131, the second transmission line 171 is a conductor pattern for transmitting a high-frequency signal exceeding 1 GHz (that is, a high-frequency AC signal), for example. A width w2 orthogonal to a longitudinal direction of the second transmission line 171, that is, a line width w2 of the second transmission line 171 is constant over the entire length of the second transmission line 171. Then, the second transmission line 171 linearly extends with its line width w2.

The second land 172 is a conductor pattern to which the second transmission line 171 is connected. The second land 172 has a circular shape having a diameter d2, for example. The diameter d2 of the second land 172 is larger than the line width w2 of the second transmission line 171.

Further, as shown in FIGS. 1 to 3, the diameter d1 of the first land 132 is smaller than the diameter d2 of the second land 172. That is, a land area S1 of the first land 132 is smaller than a land area S2 of the second land 172.

Further, the first land 132 is disposed so that, for example, a center position of the first land 132 is overlapped in the substrate thickness direction DRt with respect to a center position of the second land 172. Strictly speaking, the first land 132 is arranged so that the center positions of the lands 132, 172 in a plane direction DRp of the multilayer substrate 10 match with each other. Therefore, the first land 132 is arranged so that a projection outer shape of the first land 132 falls within a range of the projection outer shape obtained by projecting the second land 172 in the substrate thickness direction DRt. It should be noted that the plane direction DRp of the multilayer substrate 10, that is, a substrate plane direction DRp is a direction along surfaces 101 and 102 of the multilayer substrate 10 and is a direction crossing the substrate thickness direction DRt, strictly speaking, a direction orthogonal to the substrate thickness direction DRt. Then, the substrate plane direction DRp is also a plane direction DRp of each of the conductor layers 12 to 17, and it is also a plane direction DRp of each of the insulating layers 21 to 26.

Figure 4:
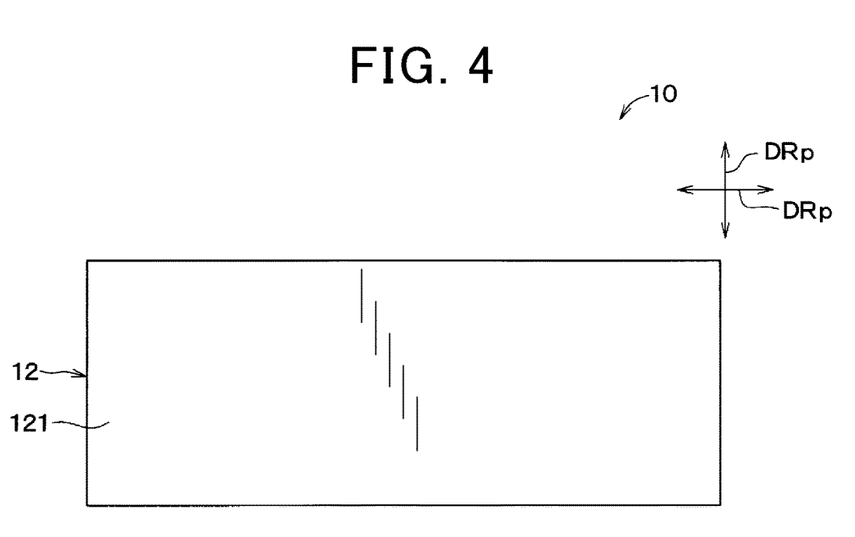
FIG. 4 shows a view of the multilayer substrate of FIG. 1 as seen from one side in a thickness direction of the substrate, that is, a view taken along an arrow IV in FIG. 1.

The first ground including layer 12 has a first ground pattern 121. The first ground pattern 121 is a conductor pattern extending in a planar shape. As shown in FIGS. 1 and 4, for example, the first ground pattern 121 is formed so as to spread in a planar shape over the entire surface of the multilayer substrate 10 in the substrate plane direction DRp.

In addition, the first ground pattern 121 is electrically connected to a member (not shown) which is set to a ground potential, whereby the first ground pattern 121 is maintained at the ground potential. In short, the first ground pattern 121 is grounded.

As shown in FIG. 1, the third conductor layer 14 includes one intermediate signal pattern 141 and two intermediate ground patterns 142, 143 as conductor patterns. Similarly, the fourth conductor layer 15 also includes one intermediate signal pattern 151 and two intermediate ground patterns 152, 153 as conductor patterns.

The first insulating layer 21 is an adjacent insulating layer adjacent to one side of the first line including layer 13 in the substrate thickness direction DRt. Therefore, the first insulating layer 21 is disposed between the first ground including layer 12 and the first line including layer 13. In other words, the first ground including layer 12 is laminated with respect to the first line including layer 13 with the first insulating layer 21 interposed therebetween.

The second ground including layer 16 is a ground including layer forming a layer different from the first ground including layer 12 among the plurality of conductor layers 12 to 17. The second ground including layer 16 is laminated with respect to the second line including layer 17 with the fifth insulating layer 25 interposed therebetween. The fifth insulating layer 25 is disposed as another insulating layer different from the first insulating layer 21 described above.

In addition, the second ground including layer 16 has a second ground pattern 161. First ground vias 34 and second ground vias 36 are disposed between the second ground pattern 161 and the first ground pattern 121. Then, the first ground vias 34 and the second ground vias 36 are bonded to the first ground pattern 121 and the second ground pattern 161, whereby the second ground pattern 161 is electrically connected to the first ground pattern 121. Specifically, the above-mentioned total of six intermediate ground patterns 133, 134, 142, 143, 152, and 153 are electrically connected to the first ground pattern 121 by the first ground vias 34 and the second ground vias 36, together with the second ground pattern 161.

Therefore, the above-mentioned total of six intermediate ground patterns 133, 134, 142, 143, 152, 153 and the second ground pattern 161 are maintained at the ground potential similarly to the first ground pattern 121. These intermediate ground patterns 133, 134, 142, 143, 152, 153, the second ground pattern 161, the first ground vias 34, and the second ground vias 36 are electrically connected to the first ground pattern 121 constituting a ground connecting portion 40 as a whole.

Figure 5:
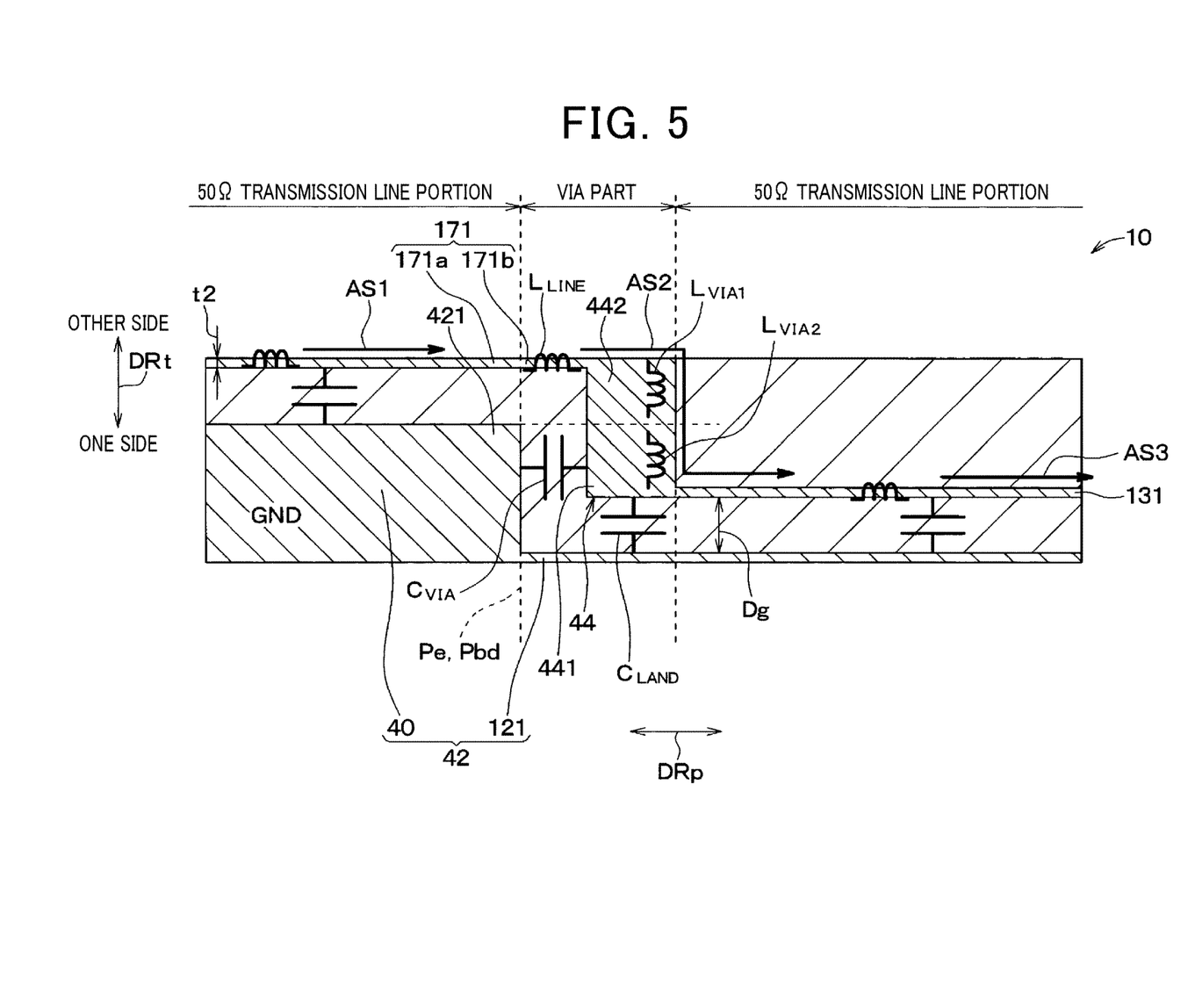
FIG. 5 schematically shows a cross section of the multilayer substrate shown in FIG. 1 and shows a schematic diagram schematically showing a capacitance component and an inductance component generated in the multilayer substrate.

Then, the ground connecting portion 40 and the first ground pattern 121 constitute a ground portion 42 maintained at the ground potential in the multilayer substrate 10. The ground portion 42 is shown in FIG. 5. FIG. 5 schematically shows a cross section of the multilayer substrate 10 shown in FIG. 1, and is a schematic diagram schematically showing a capacitance component and an inductance component generated in the multilayer substrate 10. It should be noted that the first ground vias 34 are disposed closer to the first land 132 than the second ground vias 36 are in the substrate plane direction DRp as shown in FIG. 1.

In addition to the second ground pattern 161, the second ground including layer 16 has an intermediate signal pattern 162 as shown in FIG. 1.

Signal vias 38 are disposed between the first land 132 and the second land 172 in the substrate thickness direction DRt. The signal vias 38 electrically connect the first land 132 and the second land 172 to each other. Specifically, since the total of three intermediate signal patterns 141, 151, and 162 are disposed between the first land 132 and the second land 172, the signal vias 38 electrically connect a total of three intermediate signal patterns 141, 151, and 162, the first land 132 and the second land 172 to each other.

In addition, the signal vias 38 are composed of a first to fourth signal via components 38a, 38b, 38c and 38d. The first signal via component 38a is disposed between the first land 132 and the intermediate signal pattern 141 of the third conductor layer 14 and connects the first land 132 and the intermediate signal pattern 141 to each other. In addition, the second signal via component 38b is disposed between the intermediate signal pattern 141 of the third conductor layer 14 and the intermediate signal pattern 151 of the fourth conductor layer 15 and connects the two intermediate signal patterns 141 and 151 to each other. Further, the third signal via component 38c is disposed between the intermediate signal pattern 151 of the fourth conductor layer 15 and the intermediate signal pattern 162 of the second ground including layer 16 and connects the two intermediate signal patterns 151 and 162 to each other. Furthermore, the fourth signal via component 38d is disposed between the intermediate signal pattern 162 of the second ground including layer 16 and the second land 172 and connects the intermediate signal pattern 162 and the second land 172 to each other.

Further, since the signal vias 38 are disposed, the second transmission line 171 of the second line including layer 17 is divided into two parts 171a and 171b, as shown in FIGS. 1 and 3, depending on whether the second transmission line 171 is adjacent to the second ground pattern 161 or not. That is, the second transmission line 171 includes a line portion 171a adjacent to the second ground pattern 161 with the fifth insulating layer 25 interposed therebetween, and a land connection portion 171b disposed between the line portion 171a and the second land 172. Then, the line portion 171a is connected to the second land 172 via the land connecting portion 171b.

A boundary position Pbd between the line portion 171a and the land connection portion 171b in the longitudinal direction of the second transmission line 171 matches with a position Pe of an end edge 161a on the signal via 38 side of the second ground pattern 161. A line length b2 of the land connection portion 171b is a length from a connection end 171c connected to the second land 172 to the boundary position Pbd in the land connection portion 171b in the longitudinal direction of the second transmission line 171.

Further, according to the configuration described above, in the multilayer substrate 10, the first transmission line 131, the first land 132, the signal vias 38, the second land 172, and the second transmission line 171 are connected in series in this order. Then, the first transmission line 131, the first land 132, the signal vias 38, the second land 172, and the second transmission line 171 constitute a single signal transmission path such that signals are transmitted as indicated by arrows AS1, AS2, and AS3 in FIG. 5. In the present embodiment, the signal transmission path is constituted by an impedance of, for example, 50Ω as a base.

In addition, as shown in FIGS. 1 and 5, the signal transmission path includes the signal vias 38 as described above. Therefore, the signal transmission path of the multilayer substrate 10 is constituted with two 50Ω transmission line portions 131 and 171a (hereinafter simply referred to as transmission line portions 131 and 171a) in which the impedance is maintained at 50Ω, and a via part 44 other than the transmission line portions 131 and 171a.

The transmission line portions 131 and 171a are portions where the impedance is maintained at 50Ω as described above. Therefore, the transmission line portions 131 and 171a are portions where conductor cross sections, which are orthogonal to a direction of the current flowing through the signal transmission path as a signal, are kept constant and the distances between the conductor cross sections and the ground portion 42 are kept constant and continued. That is, the first transmission line 131 corresponds to one of the two transmission line portions 131, 171a in the present embodiment. Then, the line portion 171a of the second transmission line 171 corresponds to the other one of the transmission line portions 131 and 171a.

In addition, the configuration of the transmission line portions 131 and 171a is broken in the via part 44. That is, in the via part 44, the configuration in which the conductor cross sections are constant and the distance between the conductor cross sections and the ground portion 42 are kept constant and continued is broken. Then, the cause of the break of the configuration is that the signal vias 38 are disposed in the signal transmission path of the multilayer substrate 10. Furthermore, an inductance component of the via part 44 changes with respect to an inductance component of the first transmission line 131 as a result of the break of the configuration. Therefore, the via part 44 is, in other words, a portion where the inductance component is changed with respect to the first transmission line 131 due to the disposition of the signal vias 38.

Specifically, the via part 44 is composed of the first land 132, the second land 172, the land connection portion 171b of the second transmission line 171, three intermediate signal patterns 141, 151, and 162, and the signal vias 38.

Next, a capacitance component Cv, an inductance component Lv, and an impedance Zv of the via part 44 will be described. The impedance Zv of the via part 44 is calculated based on the capacitance component Cv and the inductance component Lv of the via part 44 according to the following formula F1.

[Math. 1]

$$Z_V = \sqrt{\frac{L_V}{C_V}} \quad (F1)$$

First, as to the capacitance component Cv of the via part 44, as shown in FIGS. 1 and 5, the first land 132 and the first ground pattern 121 generate the parasitic capacitance CLAND by a capacitive coupling because they sandwich the first insulating layer 21 therebetween. This parasitic capacitance CLAND is referred to as a first parasitic capacitance CLAND.

Further, the via part 44 has a capacitive coupling part 441. The capacitive coupling part 441 is arranged side by side in the substrate plane direction DRp with respect to a first portion 421 of the ground portion 42. Thus, since the capacitive coupling part 441 is capacitively coupled to a ground-side capacitance portion 421 which is the first portion 421, a second parasitic capacitance CVIA is generated between the ground-side capacitance portion 421 and the capacitive coupling part 441. The capacitance component Cv of the via part 44 can be calculated as the sum of the first parasitic capacitance CLAND and the second parasitic capacitance CVIA.

It should be noted that, specifically, the capacitive coupling unit 441 is constituted by the first land 132, the intermediate signal pattern 162 of the second ground including layer 16, and parts between the first land 132 and its intermediate signal pattern 162 of the signal vias 38. Among the signal vias 38, the parts between the first land 132 and the intermediate signal pattern 162 are the first to third signal via components 38a to 38c.

Strictly speaking, although a parasitic capacitance also occurs at a portion other than the capacitive coupling part 441, for example, between the land connecting portion 171b of the second transmission line 171 and the ground portion 42, the parasitic capacitance is much smaller than the first and the second parasitic capacitances CLAND and CVIA. Therefore, it is considered that there is no need to consider the parasitic capacitances other than the above parasitic capacitances CLAND and CVIA in estimating the capacitance component Cv of the via part 44 by calculation.

Next, regarding the inductance component Lv of the via part 44, the inductance component Lv can be calculated as the sum of the first inductance LLINE, the second inductance LVIA1 and the third inductance LVIA2.

The first inductance LLINE is an inductance of the land connection portion 171b of the second transmission line 171. The second inductance LVIA1 is an inductance of the via intermediate portion 442 which is a portion between the land connection portion 171b and the capacitive coupling part 441. Specifically, the via intermediate portion 442 is formed by the second land 172, and the fourth signal via component 38d which is a part between the second via 172 and the intermediate signal pattern 162 of the second ground including layer 16 among the signal vias 38. In addition, the third inductance LVIA2 is an inductance of the capacitive coupling part 441.

Since the capacitance component Cv and the inductance component Lv of the via part 44 are configured in this manner, the formula F1 is expressed by the following formula F2 by using the first and second parasitic capacitances CLAND, CVIA and the first to third inductances LLINE, LVIA1, LVIA2.

[Math. 2]

$$Z_V = \sqrt{\frac{L_V}{C_V}} \approx \sqrt{\frac{L_{LINE} + L_{VIA1} + L_{VIA2}}{C_{VIA} + C_{LAND}}} \quad (F2)$$

The above formula F2 approximates and calculates the impedance Zv of the entire via part 44 from the main part. Then, the closer the impedance Zv calculated from the formula F2 is to the impedance (for example, 50Ω) of the transmission line portions 131 and 171a connected to the via part 44, the better impedance is matched, and the reflection of the transmitted signal becomes less.

The first inductance LLINE of the formula F2 is calculated by the following formula F3.

[Math. 3]

$$L_{LINE} = 0.002 \cdot b2 \cdot \left[ \log\left(\frac{2 \cdot b2}{w2 + t2}\right) + 0.25049 + \left(\frac{w2 + t2}{3 \cdot b2}\right) + \frac{\mu r \cdot T(x)}{4} \right] \quad (F3)$$

In the formula F3, b2 is a line length of the land connecting portion 171b, and its units are cm. Further, w2 is a line width of the second transmission line 171, that is, a line width of the land connection portion 171 b, and its units are cm. Furthermore, t2 is a copper foil thickness of the second transmission line 171 (in other words, a conductor pattern thickness), that is, a copper foil thickness of the land connection portion 171b, and its units are cm. In the multilayer substrate 10 of the present embodiment, the same copper foil thickness t2 is used for any conductor pattern.

In addition, μr is a relative magnetic permeability of the conductor pattern of the multilayer substrate 10, and specifically, since the conductor pattern is made of copper foil, μr is a relative permeability of copper. In addition, T (x) is a correction term calculated from the following formulas F4 and F5. Further, since the units of the first inductance LLINE obtained from the formula F3 are μH, the first inductance LLINE thereof is converted into the unit H and then substituted into the formula F2. In addition, the logarithm included in the formula F3 is a natural logarithm, and the logarithms included in the calculation formula to be described below are also natural logarithms. Further, when the same reference numerals are used among the respective calculation formulas, the same reference numerals represent the same parameters.

[Math. 4]

$$T(x) \cong \sqrt{\frac{0.873011 + 0.00186128 \cdot x}{1.0 - 0.278381 \cdot x + 0.127964 \cdot x^2}} \quad \text{(F4)}$$

[Math. 5]

$$x = \sqrt{\frac{2.0 \cdot \mu r \cdot f}{1/\sigma \times 10^{11}}} \quad \text{(F5)}$$

The correction term T (x) is calculated from the formula F4 using x in the formula F5. In the formula F5, f is a frequency of a signal transmitted by the via part 44, and its units are Hz. Further, σ is a conductivity of the conductor pattern and the signal vias 38, that is, the conductivity of copper which is a constituent material thereof, and its units are S/m.

Furthermore, the second inductance LVIA1 is calculated by the following formula F6.

[Math. 6]

$$L_{VIA1} = 0.002 \cdot bt \cdot \left[ \log\left(\frac{2 \cdot bt}{a}\right) - 1.0 + \frac{a}{bt} + \frac{\mu r \cdot T(x)}{4} \right] \quad \text{(F6)}$$

In the formula F6, bt is a length of the via intermediate portion 442 in the substrate thickness direction DRt, and its units are cm. Further, a is a radius of a virtual via cylinder obtained by averaging the via part 44 having a constant circular cross section, that is, a via radius, and its units are cm. For example, the virtual via cylinder is assumed to have the same length as the via part 44 in the substrate thickness direction DRt and have the same volume as that via part 44. In addition, since the units of the second inductance LVIA1 obtained from the formula F6 are μH, the second inductance LVIA1 thereof is converted into the unit H and then substituted into the formula F2.

The above-mentioned Formulas F3 and F6 are formulas for calculating the inductance component with respect to a portion having no ground as a reference. However, since the sectional shape of the land connecting portion 171b is rectangular while the sectional shape of the virtual via cylinder is circular, formulas applied to each are different from each other.

The third inductance LVIA2 is calculated by the following formula F7. The following Formula F7 is a formula for calculating the inductance component with respect to a portion having the reference ground.

[Math. 7]

$$L_{VIA2} = \frac{\mu}{2\pi} \log\left(\frac{h}{a} + \sqrt{\left(\frac{h}{a}\right)^2 - 1}\right) \quad \text{(F7)}$$

In the formula F7, μ is a magnetic permeability of the conductor pattern of the multilayer substrate 10, and specifically, since the conductor pattern is made of a copper foil, μ is a permeability of copper. The units of μ are H/m. Further, h is a distance in the substrate plane direction DRp between a center axis of the virtual via cylinder in the capacitive coupling part 441 and the ground-side capacitance portion 421. In other words, h is a distance between the center axis of the signal vias 38 and the ground-side capacitance portion 421 in the substrate plane direction DRp, that is, a signal via-ground distance. The units of h are cm. In addition, the units of the third inductance LVIA2 obtained from the formula F7 are H. It should be noted that the center axis of the virtual via cylinder matches with the center axis of the signal vias 38.

In addition, the second parasitic capacitance CVIA is calculated by the following formula F8. The following formula F8 is a formula for calculating a capacitance component with respect to a portion having a reference ground.

[Math. 8]

$$C_{VIA} = \frac{2\pi \cdot \varepsilon p}{\log\left(\frac{h}{a} + \sqrt{\left(\frac{h}{a}\right)^2 - 1}\right)} \quad \text{(F8)}$$

In the formula F8, εp is a dielectric constant of an insulating material disposed between the capacitive coupling part 441 of the via part 44 and the ground side capacitance portion 421 of the ground portion 42, and its units are F/m. Materials of the insulating material and the respective insulating layers 21 to 26 are the same. Further, the units of the second parasitic capacitance CVIA obtained from the formula F8 are F.

Furthermore, the first parasitic capacitance CLAND is calculated by the following formula F9. The following formula F9 is a calculation formula which is also used for capacitance calculation of the capacitor and is a calculation formula for calculating a capacitance component between parallel plates.

[Math. 9]

$$C_{LAND} = \frac{\varepsilon t \cdot S1}{Dg} \quad \text{(F9)}$$

In the formula F9, S1 is a land area of the first land 132, and its units are m2. Further, Dg is a distance between the first land 132 and the first ground pattern 121 in the substrate thickness direction DRt, that is, a distance between the land and the ground. The units of Dg are m. Furthermore, εt in the formula F9 is a dielectric constant of the insulating material disposed between the first land 132 and the first ground pattern 121, that is, a dielectric constant of the first insulating layer 21 in the present embodiment. It should be noted that since the first insulating layer 21 is made of the same material as an insulating material between the capacitive coupling part 441 and the ground-side capacitance portion 421, εt in the formula F9 is the same value as εp in the formula F8.

In addition, the units of the first parasitic capacitance CLAND obtained from the formula F9 are F.

From the above-described formulas F2 to F9, it is possible to quantitatively obtain the impedance Zv of the via part 44.

Meanwhile, in a signal transmission path that transmits a high frequency signal exceeding 1 GHz, it is required to reduce signal deterioration due to transmission loss. As shown in FIG. 1, the signal transmission path includes the first and second transmission lines 131 and 171, the first and second lands 132 and 172, the signal vias 38, and the like.

Three examples of the transmission loss in the signal transmission path are conductor loss, dielectric loss, and signal reflection. The conductor loss which is one of the transmission losses depends on a sectional shape of the conductive material generally composed of the copper foil, a size and a surface roughness of the conductive material. In addition, the dielectric loss depends on material properties of the dielectric material which is an insulator.

Further, the signal reflection is caused by the fact that the signal is hardly transmitted by reflection occurring at an impedance mismatched part of the signal transmission path. In particular, the transmission loss due to the signal reflection is remarkable in high frequency signal transmission exceeding several tens of GHz. Therefore, reducing the impedance mismatch of the signal transmission path leads to an improvement in the high frequency characteristics of the multilayer substrate 10.

The characteristic impedance Z of the signal transmission line has a relation of $Z=(L/C)^{1/2}$ where L is an inductance component and C is a capacitance component. Then, in the structure in which the signal vias 38 are disposed in the middle of the signal transmission path as in the present embodiment shown in FIG. 1, for example, the values of the two components L and C change in view of the structure between the signal vias 38 and the transmission lines 131 and 171 of the line including layers 13 and 17 connected to the signal vias 38. As a result, impedance mismatch may occur between the signal vias 38 and the transmission lines 131, 171.

Here, the inductance component per unit length of the signal vias 38 varies depending on the sectional areas of the signal vias 38, the distance between the signal vias 38 and the ground and peripheral metal, and the like. Then, if the inductance component can be canceled by the change in the capacitance component, the value of the impedance is suppressed from changing.

In view of the above, a cavity is disposed in the dielectric material in the multilayer printed substrate described in Patent Document 1, and an apparent permittivity of the dielectric material is reduced. As a result, the impedance of the multilayer printed substrate of Patent Document 1 is suppressed from changing.

On the other hand, in the present embodiment, as a contribution degree to the capacitance component Cv of the via part 44, it is noted that the contribution degree of the first parasitic capacitance CLAND generated between the first land 132 and the first ground pattern 121 shown in FIGS. 1 and 5 is large. Then, the first parasitic capacitance CLAND can be increased or decreased by changing the land diameter d1 of the first land 132, or providing a missing conductor on a part of the first ground pattern 121 capacitively coupled to the first land 132, or the like. Therefore, the impedance of the via part 44 can be adjusted by changing the land diameter d1, providing a missing conductor in a part of the first ground pattern 121, or a combination thereof, or the like. If signal reflection is suppressed from occurring in this way, the transmission characteristics of the multilayer substrate 10 are improved.

Therefore, in the present embodiment, the first parasitic capacitance CLAND has a predetermined capacitance. Then, the predetermined capacity is determined to a capacity in a size required to suppress the impedance Zv of the via part 44 from changing due to the change in the inductance component Lv of the via part 44 with respect to the first transmission line 131 using the formulas F2 to F9. Further, since only the first parasitic capacitance CLAND and the second parasitic capacitance CVIA are included in the right side of the formula F2, the first parasitic capacitance CLAND is set to the above-mentioned predetermined capacity assuming that the capacitance component Cv of the via part 44 is the sum of the capacitance CLAND and the second parasitic capacitance CVIA.

Then, adjustment of the first parasitic capacitance CLAND is performed by increasing or decreasing the land area S1 of the first land 132. That is, the first land 132 has a land area S1 determined so that the first parasitic capacitance CLAND has the predetermined capacitance.

Specifically, the first land 132 is formed so that the first parasitic capacitance CLAND becomes the above-mentioned predetermined capacitance through a plurality of steps as follows. That is, firstly, in the first step, the first to third inductances LLINE, LVIA1, LVIA2 and the second parasitic capacitance CVIA are calculated using the formulas F3 to F8.

In the subsequent second step, it is assumed that the impedance Zv of the via part 44 shown in the formula F2 is the same value as a characteristic impedance of the signal transmission path, that is, the impedance of the first transmission line 131. For example, it is assumed that the impedance Zv of the via part 44 is 50Ω. Then, using the calculated values LLINE, LVIA1, LVIA2, CVIA calculated in the first step and the formula F2, the first parasitic capacitance CLAND in the formula F2 is calculated. Then, the calculated value of the first parasitic capacitance CLAND obtained from the formula F2 is set as a target value of the first parasitic capacitance CLAND (hereinafter referred to as a first parasitic capacitance target value).

According to such a method of calculating the first parasitic capacitance target value, if the first parasitic capacitance CLAND becomes the first parasitic capacitance target value in the actual multilayer substrate 10, the impedance Zv of the via part 44 becomes about 50Ω. Then, the impedance Zv of the via part 44 with respect to the impedance of the first transmission line 131 is suppressed from changing.

In other words, calculating and determining the first parasitic capacitance target value in the second step is to determine the first parasitic capacitance target value so as to suppress the impedance Zv of the via part 44 caused by the change in the inductance component Lv of the via part 44 with respect to the first transmission line 131 from changing. It should be noted that although the first parasitic capacitance CLAND has a predetermined capacitance as described above, since the first parasitic capacitance target value is determined through such a process, the predetermined capacitance is, for example, the first parasitic capacitance target value.

In the subsequent third step, the first parasitic capacitance target value determined in the second step is substituted into CLAND in the formula F9. Then, the land area S1 of the first land 132 is calculated from the formula F9. Then, the calculated value of the land area S1 obtained from the formula F9 is determined as a target area of the land area S1. Specifically, since the first land 132 has a circular shape, the diameter d1 of the first land 132 from which the land area S1 is obtained is determined as the target diameter of the first land 132.

Since the target area of the first land 132 is determined based on the first parasitic capacitance target value in this way, the target area of the first land 132 is determined such that the first parasitic capacitance CLAND becomes the first parasitic capacitance target value.

In the subsequent fourth step, the first land 132 is formed so that the land area S1 of the first land 132 becomes the target area. Specifically, the first land 132 is formed so that the diameter d1 of the first land 132 becomes the target diameter.

It should be noted that the steps from the first step to the third step need only be completed in advance before the fourth step is carried out and there is no need to carry out the steps every time one single multilayer substrate 10 is manufactured.

Figure 6:
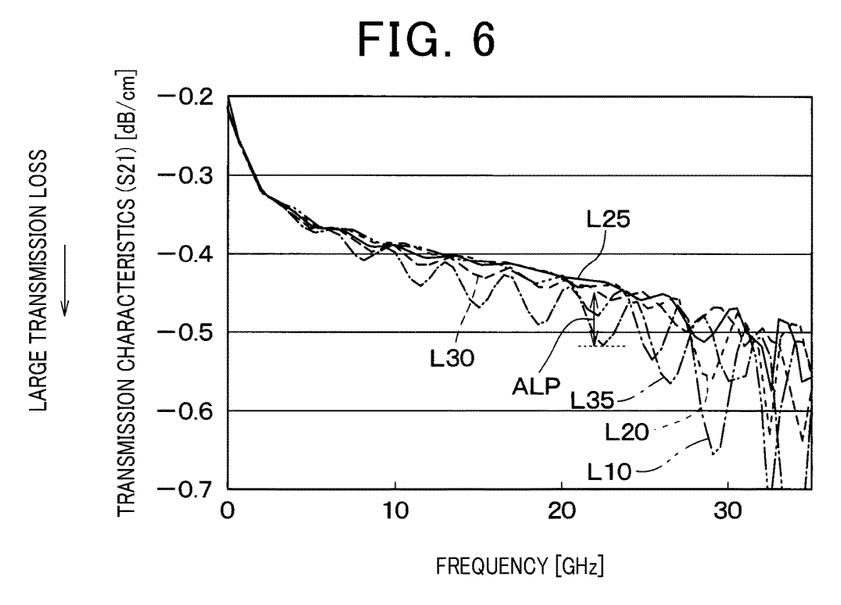
FIG. 6 shows a graph of transmission characteristics for each diameter of a first land.

Next, with reference to FIG. 6, transmission characteristics in a plurality of comparative configuration examples in which the diameter d1 of the first land 132 in the multilayer substrate 10 of FIG. 1 is variously changed will be described. In the plurality of comparative configuration examples, the diameters d1 of the first lands 132 are set to φ 100 μm, φ200 μm, φ 250 μm, φ 300 μm, and φ 350 μm, respectively. In FIG. 6, the transmission characteristics in the comparative configuration example in which the diameter d1 of the first land 132 is φ 100 μm are indicated by a curve L10. Further, the transmission characteristics in the comparative configuration example in which the diameter d1 of the first land 132 is φ 200 μm are indicated by a curve L20. Furthermore, the transmission characteristics in the comparative configuration example in which the diameter d1 of the first land 132 is φ 250 μm are indicated by a curve L25. Moreover, the transmission characteristics in the comparative configuration example in which the diameter d1 of the first land 132 is φ 300 μm are indicated by a curve L30. In addition, the transmission characteristics in the comparative configuration example in which the diameter d1 of the first land 132 is φ 350 μm are indicated by a curve L35.

As can be seen from FIG. 6, in some comparative configuration examples, ripples are generated on the high frequency side as indicated by an arrow ALP, for example, and the ripple is a factor for increasing the transmission loss.

Figure 7:
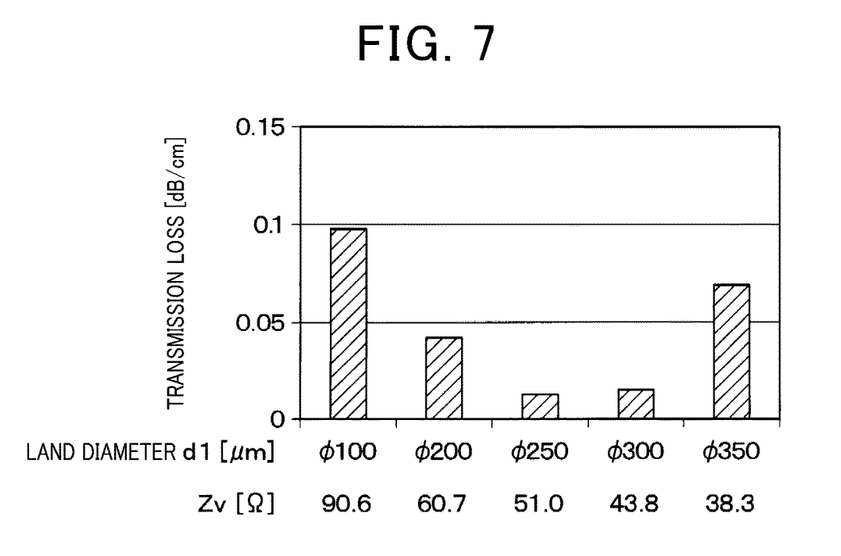
FIG. 7 shows a graph showing a relationship between a transmission loss in the multilayer substrate and an impedance of a portion, specifically, a graph showing the maximum ripple value in a range up to a frequency of 25 GHz.

Further, in FIG. 7 showing the maximum value of ripple in a range up to the frequency of 25 GHz, each impedance Zv of the via part 44 shown on a horizontal axis in FIG. 7 is the calculated value obtained from the formula F2 to formula F9. As shown in FIG. 7, among the five comparative configuration examples, the transmission loss is the minimum in the comparative configuration example in which the diameter d1 of the first land 132 is φ 250 μm. Then, in the comparative configuration example of φ250 μm, the impedance Zv shown on the horizontal axis of FIG. 7 is 51.0Ω, which is the closest to the characteristic impedance 50Ω. From this, it can be seen that the signal reflection is reduced and the transmission loss is suppressed from occurring by designing the impedance Zv of the via part 44 to a value close to 50Ω by using the approximate formulas of the above-mentioned formulas F2 to F9.

As described above, according to the present embodiment, as shown in FIGS. 1 and 5, the first land 132 and the first ground pattern 121 generate the first parasitic capacitance CLAND by the capacitive coupling because they sandwich the first insulating layer 21 therebetween. Then, the first parasitic capacitance CLAND is set to a predetermined capacitance that suppresses the impedance Zv of the via part 44 from changing due to the change in the inductance component Lv of the via part 44 with respect to the first transmission line 131.

Thereby, it is possible to match the impedance Zv of the via part 44 with the impedance of the first transmission line 131 by adjusting the first parasitic capacitance CLAND caused by the first land 132 and the first ground pattern 121. Therefore, it is possible to prevent the transmission characteristics of the multilayer substrate 10 from deteriorating without requiring the disposition of cavities such as through holes in the multilayer substrate 10.

Further, the inductance component Lv and the capacitance component Cv of the via part 44 can be easily approximated by using the above-mentioned formulas F2 to F9. Therefore, it is possible to easily and quantitatively reduce the transmission loss by adjusting only the first parasitic capacitance CLAND generated by the first land 132.

Further, according to the present embodiment, the first land 132 has the land area S1 determined so that the first parasitic capacitance CLAND becomes the predetermined capacitance. Therefore, it is possible to easily match the impedance Zv of the via part 44 with the impedance of the first transmission line 131 by appropriately setting the land area S1.

Further, according to the present embodiment, the second transmission line 171 has the line portion 171a adjacent to the second ground pattern 161 with the fifth insulating layer 25 interposed therebetween, and the land connection portion 171b disposed between the line portion 171a and the second land 172. Then, the land connecting portion 171b is included in the via part 44. Supposing that the land connecting portion 171b is not included in the via part 44, for example, the calculated value of the first parasitic capacitance CLAND as the first parasitic capacitance target value cannot be accurately calculated using the formula F2. Therefore, it is possible to estimate the inductance component Lv of the via part 44 with high accuracy compared with a case where the land connecting portion 171b is not included in the via part 44.

Further, according to the present embodiment, the first parasitic capacitance CLAND is set to the predetermined capacitance assuming that the capacitance component Cv of the via part 44 is the sum of the first parasitic capacitance CLAND and the second parasitic capacitance CVIA. Then, the second parasitic capacitance CVIA is easily calculated from the formula F8. Therefore, the capacitance component Cv of the via part 44 can be easily calculated.

In addition, according to the present embodiment, the target area of the first land 132 is determined so that the first parasitic capacitance CLAND is formed in a capacitor of a magnitude that suppresses the impedance Zv of the via part 44 from changing due to a change in the inductance component Lv of the via part 44 with respect to the first transmission line 131. Then, after determining the target area, the first land 132 is formed so that the land area S1 of the first land 132 becomes the target area.

Accordingly, it is possible to form the first land 132 so that the impedance Zv of the via part 44 matches the impedance of the first transmission line 131. Therefore, it is possible to prevent the transmission characteristics of the multilayer substrate 10 from deteriorating without requiring the disposition of cavities such as through holes in the multilayer substrate 10.

Second Embodiment

Next, a second embodiment will be described. In the present embodiment, points different from the above-described first embodiment will mainly be described. In addition, the same or equivalent components as those in the above embodiment will be omitted or simplified. This also applies to the third and subsequent embodiments which will be described later.

Figure 8:
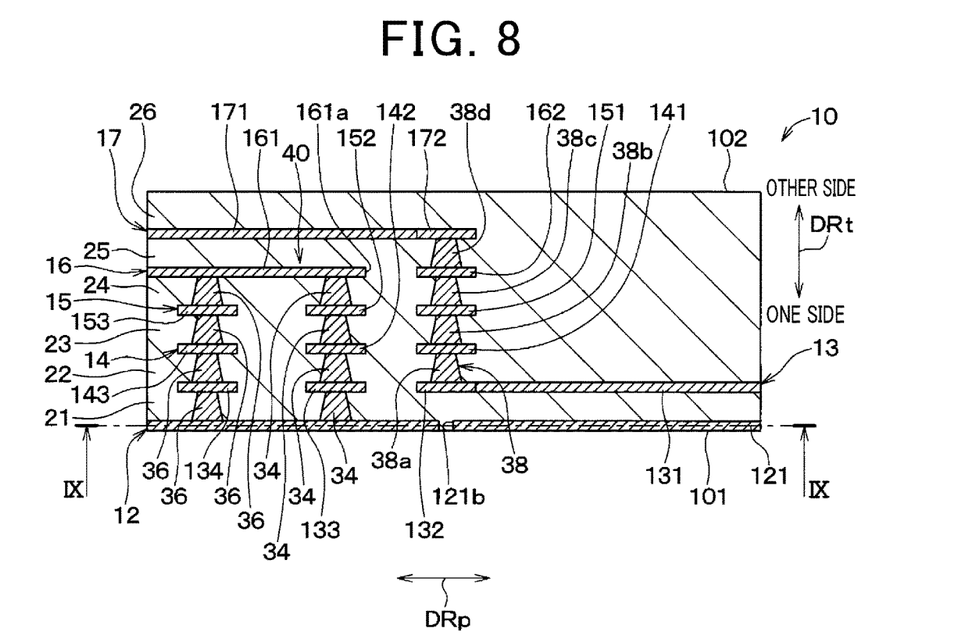
FIG. 8 shows a sectional view of a multilayer substrate in a second embodiment corresponding to FIG. 1 of the first embodiment.
Figure 9:
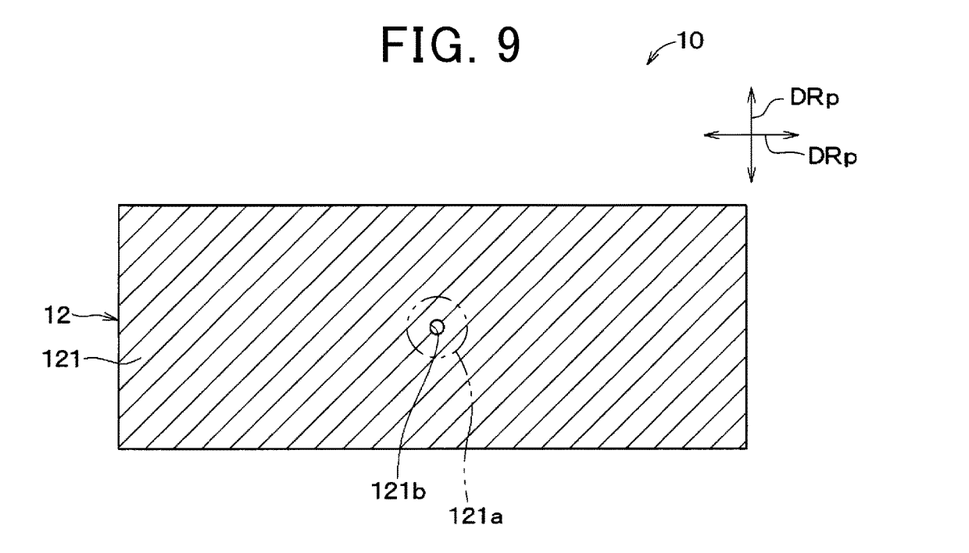
FIG. 9 shows a sectional view taken along a line IX-IX in FIG. 8.

In the present embodiment, as shown in FIGS. 8 and 9, a first ground pattern 121 is disposed with a missing portion where a conductor is partially missing. The present embodiment is different in this point from the first embodiment. Further, although a size of a second land 172 of the present embodiment is the same as that of the first embodiment, a first land 132 of the present embodiment is formed in the same as the second land 172 unlike the first embodiment.

Specifically, as shown in FIGS. 8 and 9, the first ground pattern 121 has a land facing region 121a opposed to the first land 132 in the substrate thickness direction DRt. In other words, the land facing region 121a is an area occupied by the first land 132 when the first land 132 is projected in the substrate thickness direction DRt with respect to the first ground pattern 121. Therefore, the land facing region 121a has the same outer shape as the first land 132 and has the same area as the first land 132.

Then, in at least a portion of the land facing region 121a, the conductor constituting the first ground pattern 121 is missing. For example, a hole or a cutout formed in the conductor corresponds to the missing portion. In the present embodiment, in detail, a hole 121b as a missing conductor is formed in a part of the land facing region 121a. An inside of the hole 121b is filled with, for example, the same material as the insulating material constituting the first insulating layer 21.

Providing the hole 121b as the missing portion of the conductor in the land facing region 121a of the first ground pattern 121 corresponds to reducing the land area S1 of the first land 132 in the formula F9. Therefore, the first parasitic capacitance CLAND as a parameter included in the formula F2 becomes smaller as the hole 121b becomes larger.

In view of the above, in the present embodiment, the size of the hole 121b is defined such that the difference between the impedance Zv of the via part 44 and the impedance of the first transmission line 131 is smaller than when there is no hole 121b. In other words, the hole 121b is formed with a size such that the mutual difference between the impedances is smaller than when there is no hole 121b.

As described above, according to the present embodiment, by providing the hole 121b, the first parasitic capacitance CLAND is set to a predetermined capacitance that suppresses the impedance Zv of the via part 44 from changing due to the change in the inductance component Lv of the via part 44 with respect to the first transmission line 131.

In the present embodiment, effects similar to those of the first embodiment described above can be obtained in the same manner as in the first embodiment.

Further, according to the present embodiment, the conductor is missing in a portion of the first ground pattern 121 within the land facing region 121a. Specifically, the hole 121b as the missing conductor is formed. Then, the mutual difference between the impedance Zv of the via part 44 and the impedance of the first transmission line 131 is smaller than when there is no hole 121b. Therefore, impedance matching in the signal transmission path of the multilayer substrate 10 can be easily achieved according to the shape of the first ground pattern 121.

It should be noted that in the present embodiment, unlike the first embodiment, impedance matching is not achieved by adjusting the land area S1 of the first land 132. However, also in the present embodiment, as in the first embodiment, the land area S1 of the first land 132 may be adjusted so that the impedance of the via part 44 matches the impedance of the transmission line portions 131 and 171a. This also applies to the third to fifth embodiments to be described later.

Third Embodiment

Next, a third embodiment will be described. In the present embodiment, points different from the above-described first embodiment will mainly be described.

Figure 10:
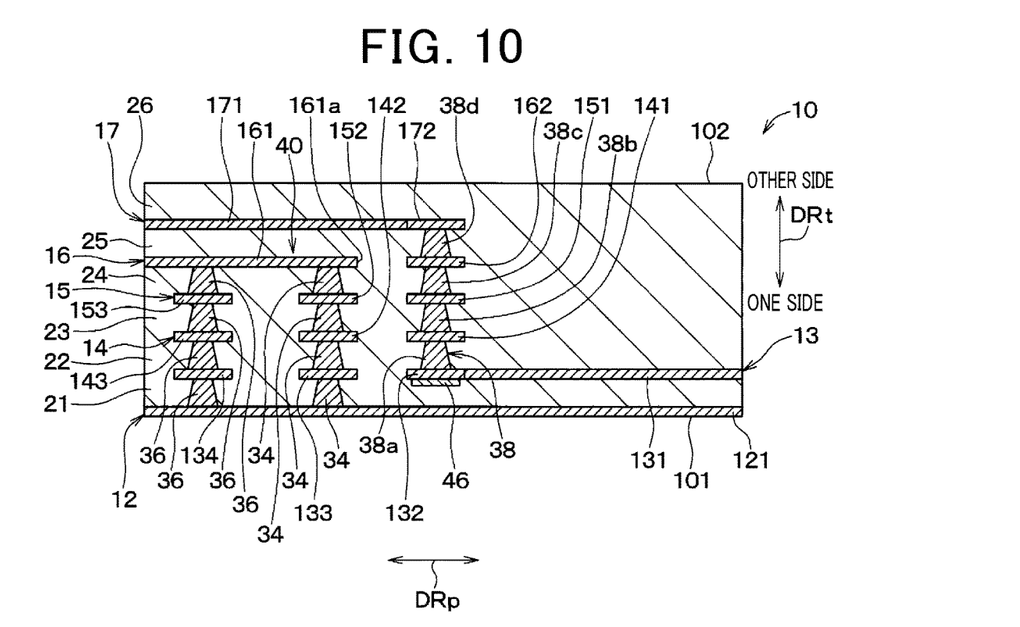
FIG. 10 shows a sectional view of a multilayer substrate in a third embodiment corresponding to FIG. 1 of the first embodiment.

In the present embodiment, as shown in FIG. 10, a multilayer substrate 10 is disposed with an adjustment insulating material 46 for adjusting the dielectric constant εt between a first land 132 and a first ground pattern 121 in the substrate thickness direction DRt. In this respect, the present embodiment is different from the first embodiment. Further, although a size of a second land 172 of the present embodiment is the same as that of the first embodiment, a first land 132 of the present embodiment is formed in the same way as the second land 172 unlike the first embodiment.

Specifically, the adjustment insulating material 46 is an insulating material having a dielectric constant different from the dielectric constant of the first insulating layer 21. Then, as shown in FIG. 10, the adjustment insulating material 46 is disposed between the first insulating layer 21 and the first land 132 in the substrate thickness direction DRt. The adjustment insulating material 46 is formed, for example, by being painted to the surface of the first land 132 on the side facing the first ground pattern 121. Therefore, the adjustment insulating material 46 is formed into a thin film along the first land 132. For example, an area of the adjustment insulating material 46 is equal to or smaller than a land area S1 of the first land 132.

Accordingly, in the present embodiment, by changing either or all of the dielectric constant, thickness, and area of the adjustment insulating material 46, the dielectric constant εt in the formula F9 can be increased or decreased. Therefore, in the present embodiment, in order to make the mutual difference between the impedance Zv of the via part 44 and the impedance of the first transmission line 131 small as compared with a case where the adjustment insulating material 46 is absent, the shape of the adjustment insulating material 46 is determined and the material thereof is selected.

As described above, in the present embodiment, by providing the adjustment insulating material 46, the first parasitic capacitance CLAND is set to a predetermined capacitance that suppresses the impedance Zv of the via part 44 from changing due to the change in the inductance component Lv of the via part 44 with respect to the first transmission line 131.

In the present embodiment, effects similar to those of the first embodiment described above can be obtained in the same manner as in the first embodiment.

Further, according to the present embodiment, the adjustment insulating material 46 is disposed between the first insulating layer 21 and the first land 132 in the substrate thickness direction DRt. Further, the mutual difference between the impedance Zv of the via part 44 and the impedance of the first transmission line 131 is smaller than when there is no adjustment insulating material 46. Therefore, by appropriately determining the material or shape of the adjustment insulating material 46, it is possible to easily match the impedance Zv of the via part 44 to the impedance of the first transmission line 131.

That is, an apparent dielectric constant between the first land 132 and the first ground pattern 121 can be changed to a configuration having no adjustment insulating material 46 without providing a cavity in the multilayer substrate 10. Therefore, it is possible to adjust the capacitance component Cv of the via part 44 with the adjustment insulating material 46, and it is possible to suppress the signal from reflecting and improve the transmission characteristics similarly to the first embodiment described above.

It should be noted that although the present embodiment is a modified example based on the first embodiment, the present embodiment can be combined with the aforementioned second embodiment.

Fourth Embodiment

Next, a fourth embodiment will be described. In the present embodiment, points different from the third embodiment described above will mainly be described.

Figure 11:
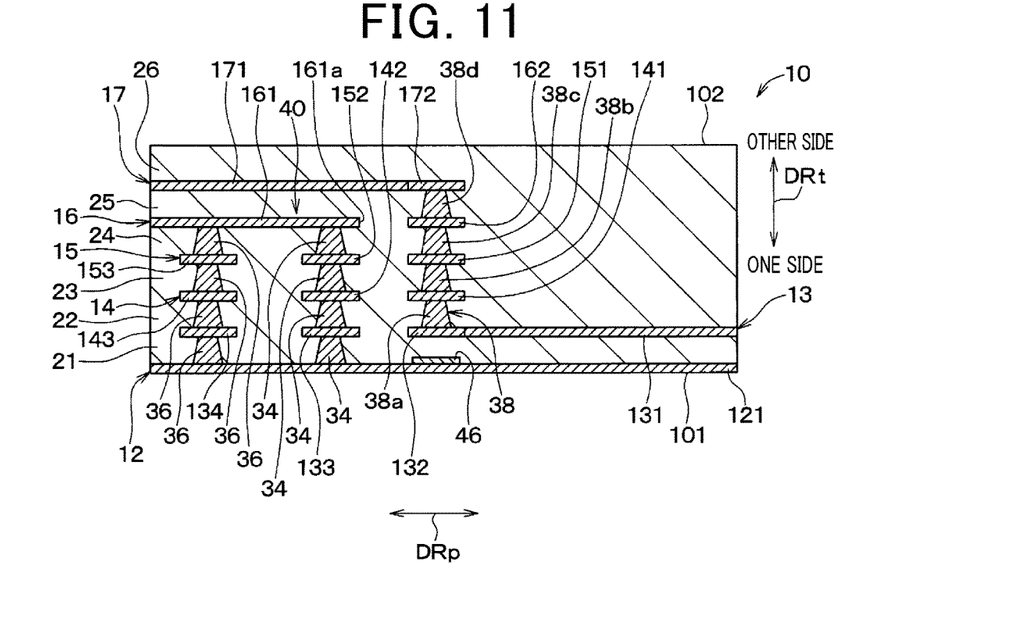
FIG. 11 shows a sectional view of a multilayer substrate in a fourth embodiment corresponding to FIG. 10 of the third embodiment.

In the present embodiment, as shown in FIG. 11, a position at which an adjustment insulating material 46 is disposed is different from that in the third embodiment.

Specifically, in the present embodiment, the adjustment insulating material 46 is not disposed between a first insulating layer 21 and a first land 132 in the substrate thickness direction DRt. The adjustment insulating material 46 is disposed between the first insulating layer 21 and a first ground pattern 121 in the substrate thickness direction DRt. However, the adjustment insulating material 46 is disposed at a position where at least a part of the adjustment insulating material 46 faces the first land 132 with the first insulating layer 21 interposed therebetween.

In the present embodiment, effects similar to those of the third embodiment can be obtained from the configuration common to the third embodiment described above. Further, as in the third embodiment described above, the present embodiment can be combined with the above-described second embodiment.

Fifth Embodiment

Next, a fifth embodiment will be described. In the present embodiment, points different from the third embodiment described above will mainly be described.

Figure 12:
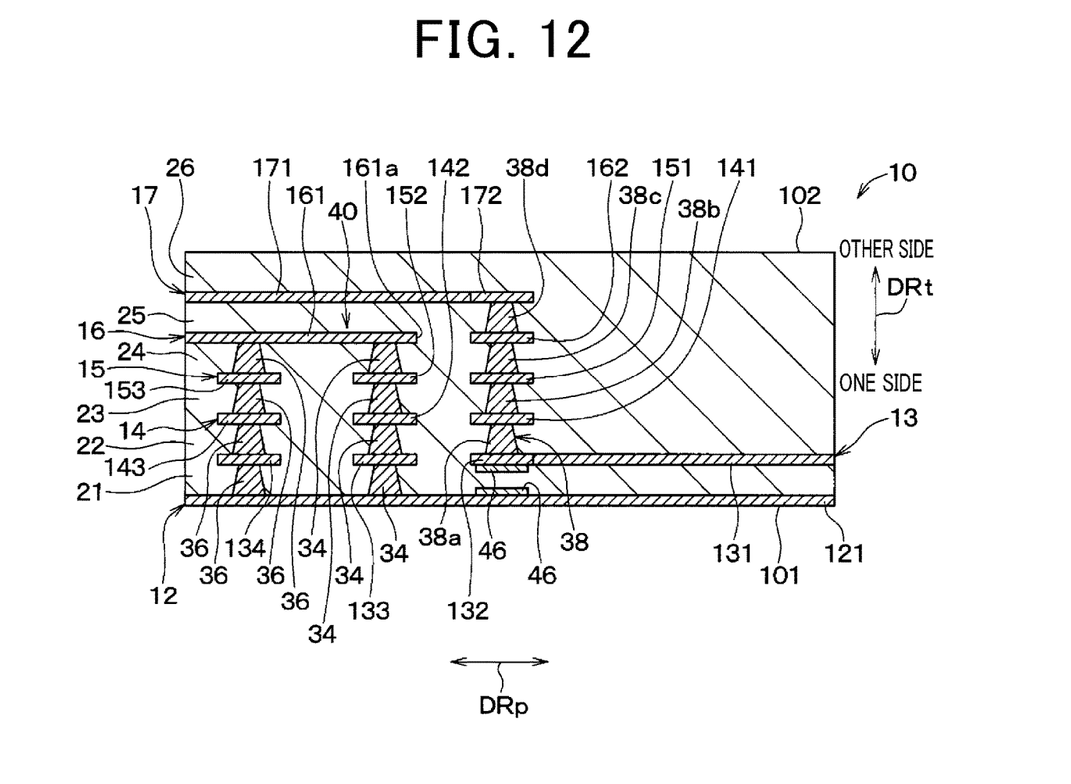
FIG. 12 shows a sectional view of a multilayer substrate in a fifth embodiment corresponding to FIG. 10 of the third embodiment.

In the present embodiment, as shown in FIG. 12, a total of two adjustment insulating materials 46 are disposed. This point is different from the third embodiment.

Specifically, in the present embodiment, the adjustment insulating material 46 is formed between a first insulating layer 21 and a first land 132 and between the first insulating layer 21 and a first ground pattern 121 in the substrate thickness direction DRt. That is, in the present embodiment, the adjustment insulating material 46 disposed between the first insulating layer 21 and the first land 132 has the same arrangement as the adjustment insulating material 46 of the third embodiment. Then, the adjustment insulating material 46 disposed between the first insulating layer 21 and the first ground pattern 121 has the same arrangement as the adjustment insulating material 46 of the fourth embodiment.

In the present embodiment, effects similar to those of the third embodiment can be obtained from the configuration common to the third embodiment described above. Further, as in the third embodiment described above, the present embodiment can be combined with the above-described second embodiment.

Other Embodiments (1) In FIGS. 1 and 5 of the first embodiment, the first parasitic capacitance CLAND is set to a predetermined capacitance, and the predetermined capacitance is, for example, a first parasitic capacitance target value. Regarding this point, the predetermined capacity may be determined so as to suppress the impedance Zv of the via part 44 from changing due to the change of the inductance component Lv of the via part 44 with respect to the first transmission line 131, and there is no limitation on how to set it.

(2) In each of the embodiments described above, the formula F2 for calculating the impedance Zv of the via part 44 includes not only the first parasitic capacitance CLAND but also the second parasitic capacitance CVIA and the first to third inductances LLINE, LVIA1, and LVIA2 as parameters. However, this is only an example, and among the plurality of parameters for calculating the impedance Zv of the via part 44, parameters other than the first parasitic capacitance CLAND may be appropriately disposed according to an actual multilayer substrate.

(3) In each of the above-described embodiments, the virtual via cylinder for calculating the formula F6 is a cylinder obtained by averaging the via parts 44 so as to have a constant circular cross section. Then, the virtual via cylinder is assumed to have the same length as the via part 44 in the substrate thickness direction DRt and have the same volume as the via part 44, for example. However, this is only an example, and as long as the virtual via cylinder has a circular shape obtained by averaging the via part 44 so as to have a constant circular cross section, there is no limitation on a method of averaging the via parts 44.

It should be noted that the present invention is not limited to the above-described embodiments but includes various modifications and variations within the equivalent scope. Further, the embodiments described above are not unrelated to each other, and can be appropriately combined, unless the combination is clearly impossible. Furthermore, in each of the above embodiments, the elements constituting the embodiments are not necessarily indispensable except in a case where it is clearly indispensable to be essential and a case where it is considered to be obviously indispensable in principle. Moreover, in each of the above embodiments, when numerical values such as a number, numerical value, quantity, range, and the like of the constituent elements of the embodiment are mentioned, it is not limited to that specific number except for a case where it is clearly indicated that it is particularly indispensable and in principle clearly limited to a specific number. In addition, when referring to the materials, shapes, positional relationships, and the like of the constituent elements in the above embodiments, its material, shape, positional relationship and the like are not limited unless otherwise specified and in principle limited to a specific material, shape, positional relationship, etc.

According to a first aspect shown in part or all of the above embodiments, a first land and a ground pattern generate parasitic capacitance due to capacitive coupling because they sandwich the adjacent insulating layer therebetween. Then, a parasitic capacitance is set to a predetermined capacitance for suppressing an impedance of a via part from changing due to a change in an inductance component of the via part with respect to a first transmission line.

Further, according to a second aspect, at least a part of a conductor in a land facing region of a ground pattern is missing. Then, a difference between an impedance of the via part and an impedance of the first transmission line is smaller than that when there is no missing. Therefore, it is possible to easily match the impedances according to a shape of the ground pattern.

Furthermore, according to a third aspect, a first land has a land area determined so that a parasitic capacitance is equal to a predetermined capacitance. Therefore, by appropriately determining the land area, it is possible to easily match the impedances of the via part with the impedance of a first transmission line.

Moreover, according to a fourth aspect, an insulating material having a dielectric constant different from a dielectric constant of an adjacent insulating layer is disposed between either one or both of an adjacent insulating layer and a first land, and the adjacent insulating layer and a ground pattern in the thickness direction. Then, a difference between an impedance of a via part and an impedance of a first transmission line is smaller than that in a case where there is no insulating material. Therefore, it is possible to easily match the impedance of the via part with the impedance of the first transmission line by appropriately determining the material or shape of the insulating material.

Further, according to a fifth aspect, a second transmission line includes a line portion adjacent to a second ground pattern with another insulating layer different from an adjacent insulating layer interposed therebetween, and a land connecting portion disposed between the line portion and a second land. Then, the land connecting portion is included in the via part. Therefore, it is possible to accurately estimate an inductance component between the first transmission line and the line portion of the second transmission line compared with a case where the land connection portion is not included in the via part.

In addition, according to a sixth aspect, assuming that the capacitance component of the via part is the sum of a first parasitic capacitance and a second parasitic capacitance, the first parasitic capacitance is set to a predetermined capacitance. Therefore, the capacitance component of the via part can be easily calculated.

Further, according to a seventh aspect, a target area of a first land is determined so that a first parasitic capacitance is formed in a capacitor of a magnitude that suppresses an impedance of a via part from changing due to a change in an inductance component of the via part with respect to a first transmission line. Then, after determining the target area, the first land is formed so that a land area of the first land becomes the target area.

What is claimed is:

1. A multilayer substrate having a plurality of conductor layers laminated in a thickness direction, the multilayer substrate comprising:
    a first line including layer having a first transmission line for transmitting a signal and a first land to which the first transmission line is connected;
    a second line including layer having a second transmission line for transmitting the signal and a second land to which the second transmission line is connected;
    an adjacent insulating layer adjacent to one side in the thickness direction with respect to the first line including layer;
    a first ground including layer laminated with the adjacent insulating layer interposed therebetween with respect to the first line including layer and having a first ground pattern extending in a planar shape;
    a signal via disposed between the first land and the second land and connecting the first land and the second land;
    another insulating layer different from the adjacent insulating layer, and
    a second ground including layer formed as a layer different from the ground including layer as a first ground including layer among the plurality of conductor layers and laminated with the second line including layer with the other insulation layer interposed therebetween, wherein
    the first line including layer, the second line including layer, and the first ground including layer are included in the plurality of conductor layers,
    the signal via, the first land, and the second land are included in a via part in which an inductance component is changed with respect to the first transmission line due to a disposition of the signal via,
    the first land and the first ground pattern generate a parasitic capacitance due to capacitive because they sandwich an adjacent insulating layer,
    the parasitic capacitance is set to a predetermined capacitance for suppressing an impedance of the via part from changing due to a change in the inductance component of the via part with respect to the first transmission line,
    the second ground including layer has a second ground pattern electrically connected to the ground pattern as a first ground pattern,
    the second transmission line includes a line portion adjacent to the second ground pattern with the other insulating layer interposed therebetween, and a land connection portion disposed between the line portion and the second land, and
    the land connecting portion is included in the via part.

2. The multilayer substrate according to claim 1, wherein the multilayer substrate further includes a ground connecting portion having the second ground pattern and electrically connected to the first ground pattern,
    the ground connecting portion and the first ground pattern constitute a ground portion,
    the via part includes a capacitive coupling part including the first land,
    the capacitive coupling portion is arranged side by side in a planar direction of the first ground including layer with respect to one portion of the ground portion so that the capacitive coupling portion is capacitively coupled to the one portion,
    the first parasitic capacitance is set to the predetermined capacity assuming that the capacitance component of the via part is the sum of the parasitic capacitance as a first parasitic capacitance and a second parasitic capacitance generated between the one portion and the capacitive coupling portion.

3. The multilayer substrate according to claim 1, wherein the first ground pattern has a land facing region opposed to the first land in the thickness direction,
    a conductor is missing in at least a portion of the land facing region, and
    a difference between the impedance of the via part and an impedance of the first transmission line is smaller than that in a case where there is no missing conductor.

4. The multilayer substrate according to claim 1, wherein the first land has a land area determined so that the parasitic capacitance becomes the predetermined capacitance.

5. The multilayer substrate according to claim 1, wherein the multilayer substrate includes an insulating material having a dielectric constant different from a dielectric constant of the adjacent insulating layer,
    the insulating material is disposed between either one or both of an adjacent insulating layer and a first land, and the adjacent insulating layer and a first ground pattern in the thickness direction, and a difference between the impedance of the via part and the impedance of the first transmission line is smaller than that in a case where there is no insulating material.

* * * * *